United States Patent
Yamaguchi et al.

(10) Patent No.: US 10,047,012 B2
(45) Date of Patent: Aug. 14, 2018

(54) OXIDE SINTERED COMPACT AND SPUTTERING TARGET FORMED FROM SAID OXIDE SINTERED COMPACT

(71) Applicant: JX Nippon Mining & Metals Corporation, Tokyo (JP)

(72) Inventors: Yohei Yamaguchi, Ibaraki (JP); Koji Kakuta, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/558,332

(22) PCT Filed: Feb. 19, 2016

(86) PCT No.: PCT/JP2016/054839
§ 371 (c)(1),
(2) Date: Sep. 14, 2017

(87) PCT Pub. No.: WO2016/152349
PCT Pub. Date: Sep. 29, 2016

(65) Prior Publication Data
US 2018/0065893 A1  Mar. 8, 2018

(30) Foreign Application Priority Data
Mar. 23, 2015 (JP) .................................. 2015-059039

(51) Int. Cl.
*C04B 35/453* (2006.01)
*C23C 14/34* (2006.01)

(52) U.S. Cl.
CPC ........ *C04B 35/453* (2013.01); *C23C 14/3414* (2013.01); *C04B 2235/3284* (2013.01); *C04B 2235/3286* (2013.01); *C04B 2235/786* (2013.01)

(58) Field of Classification Search
CPC .......................... C04B 35/453; C23C 14/3414
See application file for complete search history.

(56) References Cited

U.S. PATENT DOCUMENTS

| | | | |
|---|---|---|---|
| 6,528,442 B1 | 3/2003 | Kuwano et al. | |
| 7,674,404 B2 | 3/2010 | Osada | |
| 7,682,529 B2 | 3/2010 | Osada | |
| 7,686,985 B2 | 3/2010 | Osada | |
| 7,699,965 B2 | 4/2010 | Ikisawa et al. | |
| 8,007,693 B2 | 8/2011 | Ikisawa et al. | |
| 8,148,245 B2 | 4/2012 | Ikisawa et al. | |
| 8,623,511 B2 * | 1/2014 | Kawashima | C04B 35/01 428/412 |

(Continued)

FOREIGN PATENT DOCUMENTS

| | | |
|---|---|---|
| JP | 2003-183820 A | 7/2003 |
| JP | 2013-129545 A | 7/2013 |

(Continued)

*Primary Examiner* — Karl E Group
(74) *Attorney, Agent, or Firm* — Howson & Howson LLP

(57) ABSTRACT

An IGZO sintered compact composed of indium (In), gallium (Ga), zinc (Zn), oxygen (O) and unavoidable impurities, wherein an average length of cracks existing in the IGZO sintered compact is 3 μm or more and 15 μm or less. Provided is a sputtering target capable of suppressing the target cracks and reducing the generation of particles during deposition via DC sputtering, and forming favorable thin films.

5 Claims, 3 Drawing Sheets

(56) References Cited

U.S. PATENT DOCUMENTS

| | | | |
|---|---|---|---|
| 8,784,700 B2* | 7/2014 | Inoue | C04B 35/01 |
| | | | 252/519.1 |
| 9,045,823 B2 | 6/2015 | Osada et al. | |
| 9,147,706 B2* | 9/2015 | Koyama | H01L 27/1461 |
| 2009/0197757 A1 | 8/2009 | Fukushima | |
| 2010/0108502 A1 | 5/2010 | Inoue et al. | |
| 2011/0168994 A1 | 7/2011 | Kawashima et al. | |
| 2012/0103804 A1* | 5/2012 | Ikisawa | C01G 15/006 |
| | | | 204/298.13 |
| 2012/0118726 A1* | 5/2012 | Yano | C04B 35/01 |
| | | | 204/192.25 |
| 2012/0228133 A1* | 9/2012 | Itose | C04B 35/01 |
| | | | 204/298.13 |
| 2013/0320333 A1* | 12/2013 | Koyama | H01L 27/1461 |
| | | | 257/43 |
| 2013/0341181 A1 | 12/2013 | Park et al. | |
| 2014/0158951 A1 | 6/2014 | Yamanobe et al. | |

FOREIGN PATENT DOCUMENTS

| | | |
|---|---|---|
| JP | 2014-024738 A | 2/2014 |
| JP | 2014-040348 A | 3/2014 |
| JP | 2014-105383 A | 6/2014 |
| JP | 2014-114473 A | 6/2014 |
| JP | 2014-125422 A | 7/2014 |
| JP | 2015-024944 A | 2/2015 |

\* cited by examiner

OXIDE SINTERED COMPACT AND SPUTTERING TARGET FORMED FROM SAID OXIDE SINTERED COMPACT

BACKGROUND

The present invention relates to an oxide composed of indium (In), gallium (Ga), zinc (Zn), oxygen (O), and unavoidable impurities (generally referred to as "IGZO"; and the term "IGZO" will be used in the ensuing explanation as appropriate), and particularly relates to an IGZO sintered compact and a sputtering target formed from such IGZO sintered compact.

Conventionally, α-Si (amorphous silicon) has been used for a TFT (thin film transistor) as a backplane of an FPD (flat panel display). Nevertheless, sufficient electron mobility cannot be obtained when using α-Si. Thus, in recent years, research and development of TFT using an In—Ga—Zn—O-based oxide (IGZO), which has higher electron mobility than α-Si, is being conducted. In addition, a next-generation high-performance flat panel display using IGZO-TFT has been partially been put into practical application, and is attracting attention.

An IGZO film is generally deposited by sputtering a target which is prepared from an IGZO sintered compact. The IGZO sintered compact includes a sintered compact having a (111) composition of In:Ga:Zn=1:1:1 (atomic ratio). Nevertheless, this sintered compact having a (111) composition has problems in that the growth of crystal grains is fast and, therefore, the adjustment of the grain size is difficult. When the crystal grain size becomes too large, cracks are easily generated at the crystal grain boundary, and the strength of the sintered compact will considerably deteriorate.

Patent Documents 1 to 6 basically describe that, in an IGZO sintered compact having a (111) composition, the transverse intensity of the sintered compact can be increased based on unique sintering methods. Specifically, in the case of using a microwave heating furnace or an electric furnace with a general-purpose resistance heater, the growth of crystal grains is inhibited and the transverse intensity is increased by drastically shortening the sintering time to 1 to 2 hours. Nevertheless, the microwave heating can achieve rapid heating or short-time sintering, but there are problems in that uneven heating may arise due to local heating, and the size of the sintered compact is restricted due to the limitation in the size of the furnace, and thus this is unsuitable for mass production. Moreover, when the sintering time is drastically shortened with an electric furnace, the growth of the crystal grains can be suppressed, but the structure may become uneven between the surface part and the inside of the sintered compact, the sintered compact may be subject to warping or strains more easily, and this may lead to the considerable deterioration in the yield.

Moreover, an IGZO sintered compact is required to have a sufficiently low bulk resistance to enable stable DC sputtering. Generally speaking, when the bulk resistance is high, DC sputtering becomes difficult, and, even if DC sputtering is possible, high power needs to be input in order to attain a practical deposition rate. Furthermore, when the bulk resistance is high, the probability of the generation of an abnormal discharge will increase, and there are problems in that this may lead to an adverse effect on the film caused by the generation of particles, and the occurrence of cracks or fractures of the sputtering target. Note that the Examples in Patent Documents 1 to 6 describe that deposition was performed via DC sputtering, but there are no specific descriptions concerning the bulk resistance of the sintered compact.

CITATION LIST

Patent Documents

Patent Document 1: JP 2013-129545 A
Patent Document 2: JP 2014-040348 A
Patent Document 3: JP 2014-024738 A
Patent Document 4: JP 2014-114473 A
Patent Document 5: JP 2014-105383 A
Patent Document 6: JP 2014-125422 A

SUMMARY

An object of the present invention is to provide an IGZO oxide sintered compact having a high transverse intensity and a low bulk resistance. The sputtering target formed from the IGZO oxide sintered compact can drastically reduce the target cracks and the generation of particles during deposition, and form favorable thin films.

As a result of intense study in order to achieve the foregoing object, the present inventors focused on the cracks generated in the IGZO sintered compact, and discovered that control of crack length can achieve an increase in the transverse intensity and a lowering of the bulk resistance of the sintered compact (sputtering target), and consequently enables favorable DC sputtering and improvement in the quality of the obtained thin film.

Based on the foregoing discovery, the present inventors provide the following invention.
1) An IGZO sintered compact composed of indium (In), gallium (Ga), zinc (Zn), oxygen (O) and unavoidable impurities, wherein an average length of cracks existing in the IGZO sintered compact is 3 μm or more and 15 μm or less.
2) The IGZO sintered compact according to 1) above, wherein a maximum length of cracks existing in the IGZO sintered compact is 6 μm or more and 45 μm or less.
3) The IGZO sintered compact according to 1) or 2) above, wherein the IGZO sintered compact has a transverse intensity of 50 MPa or more, and a bulk resistance of 100 mΩcm or less.
4) The IGZO sintered compact according to any one of 1) to 3) above, wherein an atomic ratio of In, Ga, and Zn satisfies the following formulae:

$$0.314 \leq In/(In+Ga+Zn) \leq 0.342;$$

$$0.314 \leq Ga/(In+Ga+Zn) \leq 0.342; \text{ and}$$

$$0.325 \leq Zn/(In+Ga+Zn) \leq 0.364.$$

5) The IGZO sintered compact according to any one of 1) to 4) above, wherein the IGZO sintered compact has an average crystal grain size of 22 μm or less.
6) The IGZO sintered compact according to any one of 1) to 5) above, wherein the IGZO sintered compact has a density of 6.10 g/cm$^3$ or more.
7) A plate-shaped or cylindrical sputtering target formed from the IGZO sintered compact according to any one of 1) to 6) above.

The present invention yields superior effects that both a high transverse intensity and a low bulk resistance can be achieved in an IGZO-based oxide sintered compact composed of indium (In), gallium (Ga), zinc (Zn), oxygen (O)

and unavoidable impurities by appropriately controlling the length of cracks existing in the sintered compact, and stable DC sputtering can be performed with minimal generation of particles.

DETAILED DESCRIPTION

Figure 1:
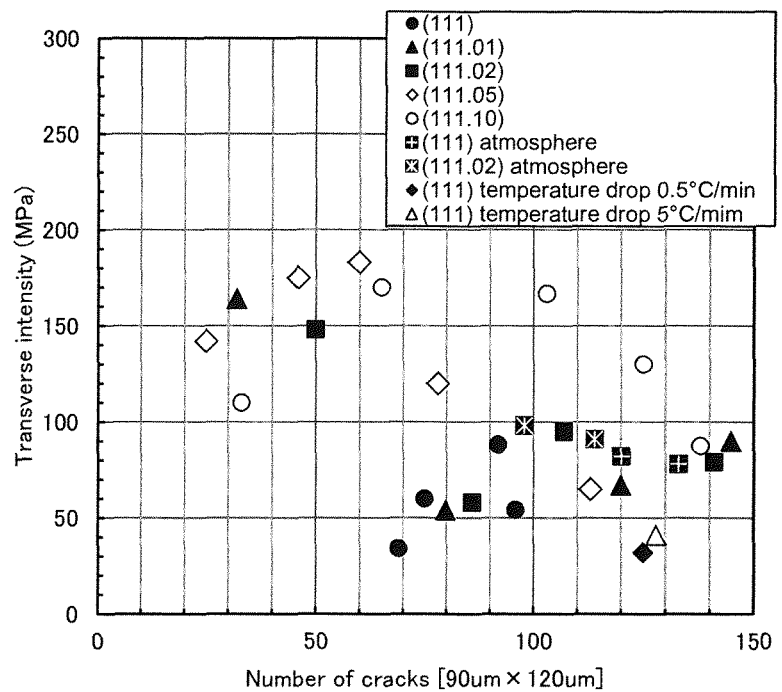
FIG. 1 This is a diagram showing the relation of the number of cracks and the transverse intensity.

With an IGZO sintered compact, cracks tend to be generated at the crystal grain boundary, and there are problems in that the strength of the sintered compact becomes considerably deteriorated. It has been thought that the reduction in the number of cracks existing in the sintered compact would lead to the increase in the transverse intensity. Nevertheless, when the relation of the number of cracks and the transverse intensity of the sintered compact is plotted, the number of cracks and the transverse intensity of the sintered compact are not necessarily correlated as shown in FIG. 1, and there are cases where the transverse intensity is high even when the number of cracks is large.

As a result of conducting additional research regarding the relation of cracks and the transverse intensity, the present inventors discovered that a high transverse intensity can be achieved, even when the number of cracks was numerous, by controlling the length of the cracks to be within a certain range. Furthermore, the present inventors discovered that a low bulk resistance could be achieved in addition to a high transverse intensity by controlling the length of the cracks. Based on this kind of discovery, the present invention is unique with regard to the length of the cracks, particularly with regard to the average length and the maximum length of the cracks.

The sintered compact of the present invention is characterized by being composed of indium (In), gallium (Ga), zinc (Zn), oxygen (O) and unavoidable impurities, wherein an average length of cracks existing in the IGZO sintered compact is 3 μm or more and 15 μm or less. When the average length of the cracks exceeds 15 μm, the transverse intensity of the sintered compact will deteriorate; but, when the average length of the cracks is less than 3 μm, the bulk resistance of the sintered compact will increase. Both situations are thus undesirable.

Moreover, with the present invention, the maximum length of cracks existing in the sintered compact is preferably 6 μm or more and 45 μm or less. When the maximum length of the cracks exceeds 45 μm, the transverse intensity of the sintered compact will deteriorate; but, when the maximum length of the cracks is less than 6 μm, the bulk resistance of the sintered compact will increase. Both situations are thus undesirable. Note that there is no particular limitation in the number of cracks in the present invention, and a high mechanical strength and a low resistance can be achieved so as long as the length of the cracks falls within a certain range.

In the present invention, measurement of length of the cracks is performed by observing a cross section of the sintered compact (sputtering target) with a scanning electron microscope (SEM), and measuring the length of the cracks existing in the SEM image (visual field: 90 μm×120 μm). The average value and the maximum value are obtained from the measured lengths. Specifically, in the case of a rectangular plate-shaped target, samples are extracted from a total of five locations; specifically, a part near the center and the four corners of the target. For each sample, a 100× SEM image is produced by scanning an arbitrary cross-section surface of the target, the length (and number) of cracks in an area of 90 μm×120 μm on the image is measured, and the average value and the maximum value of crack lengths in the five locations are obtained.

Figure 6:
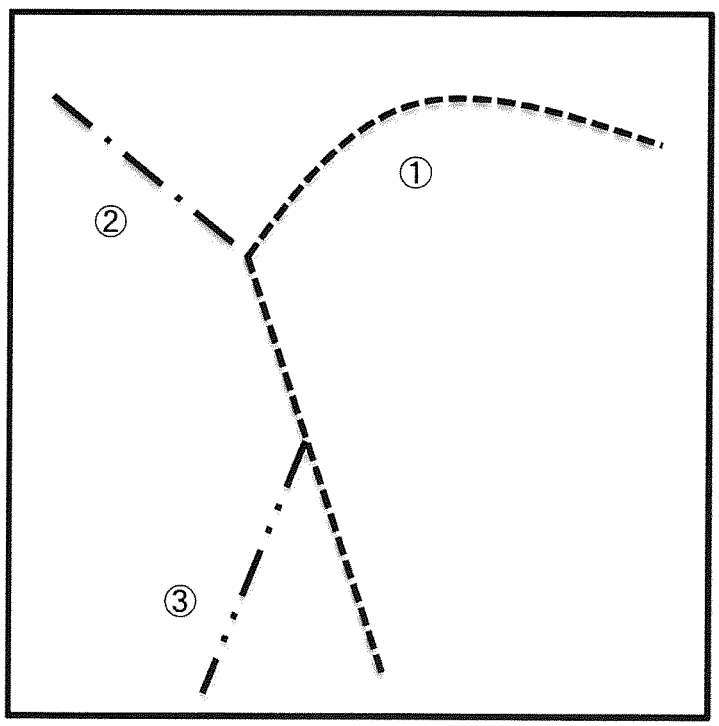
FIG. 6 This is a diagram related to the measurement of the number of cracks and the length.

There are cases where a crack is in the form of a straight line, in the form of a broken line, or in the form of a curved line, or a crack that has several branches arising from half-way points of the crack. With regard to a crack that does not have any branches, the crack length is obtained by measuring the entire length of the crack on the SEM image. Meanwhile, with regard to a crack that has branches, the longest part (which corresponds to 1 in FIG. 6) from one end of a crack to the other end via one or more branch points is considered to be one crack, and each one of the other branches (which correspond to 2 and 3), which are the parts connecting the respective ends and their branch points, is also considered to be one crack; and, with regard to the respective cracks, the length is measured in the same manner as a crack that does not have any branches.

The oxide sintered compact of the present invention has a transverse intensity of 50 MPa or more and a bulk resistance of 100 mΩcm or less. When the transverse intensity is less than 50 MPa, cracks may be generated in the target during sputtering. When the bulk resistance exceeds 100 mΩcm, even though DC sputtering may be possible, abnormal discharge may arise during sputtering that is performed for a long period. In some cases, a discharge may not occur in DC sputtering, and thus there is no choice but to apply RF sputtering alternatively.

Moreover, in the present invention, the atomic ratio of In, Ga and Zn of the oxide sintered compact preferably satisfies the following formulae:

$$0.314 \leq In/(In+Ga+Zn) \leq 0.342;$$

$$0.314 \leq Ga/(In+Ga+Zn) \leq 0.342; \text{ and}$$

$$0.325 \leq Zn/(In+Ga+Zn) \leq 0.364.$$

By making the composition of an IGZO sintered compact to be Zn-rich from a (111) composition, it is possible to realize a bulk resistance which enables high mechanical strength and stable DC sputtering.

Note that the respective component amounts may vary during blending, mixing and sintering the raw material powders. For example, in cases where the intended composition is In:Ga:Zn=1:1:1, variation may arise in a range of In:Ga:Zn=1±0.02:1±0.02:1±0.02, and thus it may be out of a Zn-rich state, but such fact shall not be grounds for denying the present invention.

The oxide sintered compact of the present invention preferably has an average crystal grain size of 22 μm or less. The mechanical strength can be increased by causing the average grain size to fall within the foregoing numerical range. When the average grain size exceeds 22 μm, the mechanical strength will decrease and, when excessive power is input during sputtering, there is a possibility that cracks may arise in the sintered compact due to the stress caused by the difference in thermal expansion between the sputtering target (sintered compact) and the backing plate that is bonded with the target.

Moreover, the oxide sintered compact of the present invention preferably has a density of 6.10 g/cm$^3$ or more. When the oxide sintered compact of the present invention is used as a sputtering target, superior effects are yielded in that high densification of the sintered compact will increase the uniformity of the sputtered film, and particle generation during sputtering can be significantly reduced.

A representative example of the production method of the oxide sintered compact of the present invention is as follows.

As raw materials, indium oxide ($In_2O_3$), gallium oxide ($Ga_2O_3$), and zinc oxide (ZnO) are prepared. In order to avoid the adverse effects on the electrical properties caused by impurities, it is desirable to use raw materials having a purity of 4N or higher. The respective raw materials are weighed to achieve a predetermined compositional ratio. Note that these raw materials contain unavoidable impurities.

Next, the respective raw materials are mixed so that the oxide sintered compact is to have a predetermined compositional ratio. If the mixing is insufficient, the respective components in the target may become segregated, and cause an abnormal discharge such as arcing, or cause particle generation during the sputtering. Thus, the mixing is preferably performed sufficiently. Furthermore, by subjecting the mixed powder to pulverization and granulation, it is possible to improve the moldability and sinterability of the mixed powder, and thereby obtain a high-density sintered compact. As the means for performing the mixing and pulverization processes, for instance, a commercially available mixer, ball mill, beads mill or the like may be used, and as the means for the granulation process, for instance, a commercially available spray drier may be used.

Next, the mixed powder is filled in a mold, and subject to uniaxial pressing under the following conditions; specifically, a surface pressure of 400 to 1000 kgf/cm$^2$, and a holding time of 1 to 3 minutes, to obtain a plate-shaped green compact. When the surface pressure is less than 400 kgf/cm$^2$, it is not possible to obtain a green compact having a sufficient density. Moreover, even if excessive surface pressure is applied, the density of the green compact hardly increases beyond a certain level, and a density distribution tends to become generated in the green compact in principle when being subject to uniaxial pressing, and causes deformation and cracks during sintering. Thus, a surface pressure of 1000 kgf/cm$^2$ or more is not particularly required for production.

Next, this green compact is subject to double vacuum packing in vinyl, and CIP (cold isostatic pressing) under the following conditions; specifically, a pressure of 1500 to 4000 kgf/cm$^2$, and a holding time of 1 to 3 minutes. When the pressure is less than 1500 kgf/cm$^2$, it is not possible to obtain a sufficient effect of CIP. Meanwhile, even if pressure of 4000 kgf/cm$^2$ or more is applied, the density of the green compact hardly increases beyond a certain level, and therefore, a surface pressure of 4000 kgf/cm$^2$ or more is not particularly required for production.

Next, the green compact is subject to sintering at a temperature of 1250 to 1430° C. and a holding time of 10 to 24 hours, in an air atmosphere or an oxygen atmosphere. The sintering temperature of lower than 1250° C. is undesirable, since oxygen becomes less eliminated from the sintered compact, the oxygen defect concentration will deteriorate, and the carrier concentration will deteriorate (that is, the bulk resistance will increase). Meanwhile, when the sintering temperature is 1430° C. or higher, the size of the crystal grains in the sintered compact becomes too large, and the mechanical strength of the sintered compact may deteriorate. Moreover, when the holding time is less than 10 hours, it is not possible to obtain a sintered compact having a sufficient density, and, when the holding time is longer than 24 hours, this is undesirable from the perspective of production cost. What is particularly important in controlling the length of the cracks is to appropriately control the sintering temperature in the relation with the composition of the sintered compact. Furthermore, the temperature-drop rate from the highest sintering temperature upon cooling the sintered compact is preferably 1° C./min to 3° C./min. When the temperature-drop rate is too slow, the growth of crystal grains will proceed even during the temperature-drop process and the grain size will become too large, and in the case of a sintered compact such as IGZO which has a layered structure and a large anisotropy of the crystal structure, there is a possibility that the generation of cracks will be induced and cause deterioration in the sintered compact strength. Meanwhile, when the temperature-drop rate is too fast, significant residual stress is generated in the sintered compact due to the difference in thermal expansion inside and outside of the sintered compact, and may cause the deterioration in the strength of the sintered compact and/or cause the generation of cracks during sintering.

In the molding/sintering processes, HP (hot pressing) and HIP (hot isostatic pressing) may be used other than the foregoing methods. The sintered compact obtained as described above is processed into a target shape via machining such as grinding and/or polishing to obtain a sputtering target. Note that, upon preparing an oxide semiconductor film, the sputtering target obtained as described above is sputtered under predetermined conditions to deposit a film, and, as needed, the deposited film is subject to annealing at a predetermined temperature to obtain an oxide semiconductor film.

In the present invention, the transverse intensity is measured based on a three-point bending test in accordance with JISR1601:2008. Specifically, the measurement is performed using ten samples having dimensions, in which the total length is 40 mm ±0.1 mm, the width is 4 mm ±0.1 mm, and the thickness is 3 mm ±0.1 mm, at a span between supports of 30 mm ±0.1 mm, and a crosshead speed of 0.5 mm/min, and the measurement results are averaged.

For obtaining the average grain size, samples are extracted from a total of five locations; specifically, a part near the center and at the four corners of a rectangular plate-shaped target. For each sample, a 300× SEM image is produced by scanning an arbitrary cross-section surface of the target, five straight lines are drawn on the image to obtain code lengths by measuring the length in which each straight line intersects with the crystal grains, these code lengths are averaged, and a value obtained by multiplying the average value by a coefficient of 1.78 is used as the crystal grain size.

Moreover, the sintered compact density and the bulk resistance are obtained by, for each of the samples extracted from a total of five locations; specifically, a part near the center and at the four corners of a rectangular plate-shaped target, measuring the sintered compact density by the Archimedean method and the bulk resistance by the four probe method, and respectively calculating the average values by dividing the measurement results by the number of measurement locations.

EXAMPLES

The present invention is now explained based on Examples and Comparative Examples. Note that the following Examples are merely illustrative, and the present invention is not limited to such Examples. In other words, the present invention is limited only based on the scope of claims, and the present invention also covers the other modes and modifications included therein.

Example 1

An $In_2O_3$ powder, a $Ga_2O_3$ powder, and a ZnO powder were weighed so that the compositional ratio of the sintered compact becomes 1.00:1.00:1.00 in terms of an atomic ratio of In, Ga and Zn, and these powders were mixed and pulverized based on a wet process, and subsequently dried and granulated with a spray drier to obtain a mixed powder.

Next, the mixed powder was subject to uniaxial pressing at a surface pressure of 400 to 1000 kgf/cm$^2$ to obtain a green compact. Next, the obtained green compact was subject to double vacuum packing in vinyl, and CIP (cold isostatic pressing) at 1500 to 4000 kgf/cm$^2$, and thereafter sintered in an oxygen atmosphere at a temperature of 1350° C. for 15 hours, and, after a temperature drop to 500° C. at 1.67° C./min, the obtained sintered compact was allowed to cool in the furnace.

As a result of observing the obtained IGZO sintered compact via SEM, the average length of cracks existing in the visual field of 90 μm×120 μm of the SEM image was 13.2 μm, and the maximum length of cracks was 41.9 μm. Moreover, the transverse intensity of the sintered compact was 54 MPa, the bulk resistance was 78.2 mΩcm, and an IGZO sintered compact having a high mechanical strength and a low resistance was obtained. Moreover, the average grain size of the sintered compact was 21.8 μm, the sintered compact density was 6.34 g/cm$^3$, and a high-density IGZO sintered compact was obtained. The foregoing results are shown in Table 1.

TABLE 1

| | Sintered compact composition | | | Sintering temperature | Sintering time | Sintering | Temperature | Grain size |
|---|---|---|---|---|---|---|---|---|
| | In | Ga | Zn | (° C.) | (hr) | atmoshpere | drop rate | (μm) |
| Comparative Example 1 | 1.00 | 1.00 | 1.00 | 1430 | 15 | Oxygen | 1.67 | 34.9 |
| Example 1 | | | | 1350 | 15 | Oxygen | 1.67 | 21.8 |
| Comparative Example 2 | | | | 1300 | 15 | Oxygen | 1.67 | 17.9 |
| Comparative Example 3 | | | | 1250 | 15 | Oxygen | 1.67 | 11.1 |
| Example 2 | 1.00 | 1.00 | 1.01 | 1430 | 15 | Oxygen | 1.67 | 20.5 |
| Example 3 | | | | 1350 | 15 | Oxygen | 1.67 | 15.6 |
| Example 4 | | | | 1300 | 15 | Oxygen | 1.67 | 10.9 |
| Comparative Example 4 | | | | 1250 | 15 | Oxygen | 1.67 | 8.3 |
| Example 5 | 1.00 | 1.00 | 1.02 | 1430 | 15 | Oxygen | 1.67 | 18.1 |
| Example 6 | | | | 1350 | 15 | Oxygen | 1.67 | 12.2 |
| Example 7 | | | | 1300 | 15 | Oxygen | 1.67 | 10.5 |
| Comparative Example 5 | | | | 1250 | 15 | Oxygen | 1.67 | 7.2 |
| Example 8 | 1.00 | 1.00 | 1.05 | 1430 | 15 | Oxygen | 1.67 | 13.7 |
| Example 9 | | | | 1350 | 15 | Oxygen | 1.67 | 10.5 |
| Example 10 | | | | 1300 | 15 | Oxygen | 1.67 | 8.2 |
| Example 11 | | | | 1275 | 15 | Oxygen | 1.67 | 6.9 |
| Comparative Example 6 | | | | 1250 | 15 | Oxygen | 1.67 | 5.5 |
| Example 12 | 1.00 | 1.00 | 1.10 | 1430 | 15 | Oxygen | 1.67 | 9.9 |
| Example 13 | | | | 1350 | 15 | Oxygen | 1.67 | 8.0 |
| Example 14 | | | | 1300 | 15 | Oxygen | 1.67 | 6.2 |
| Example 15 | | | | 1275 | 15 | Oxygen | 1.67 | 6.0 |
| Comparative Example 7 | | | | 1250 | 15 | Oxygen | 1.67 | 5.3 |
| Example 16 | 1.00 | 1.00 | 1.00 | 1350 | 15 | Atmosphere | 1.67 | 14.0 |
| Example 17 | 1.00 | 1.00 | 1.00 | 1300 | 15 | Atmosphere | 1.67 | 11.0 |
| Example 18 | 1.00 | 1.00 | 1.02 | 1350 | 15 | Atmosphere | 1.67 | 10.3 |
| Example 19 | 1.00 | 1.00 | 1.02 | 1300 | 15 | Atmosphere | 1.67 | 9.0 |
| Comparative Example 8 | 1.00 | 1.00 | 1.00 | 1350 | 15 | Oxygen | 0.5 | 27.7 |
| Comparative Example 9 | 1.00 | 1.00 | 1.00 | 1350 | 15 | Oxygen | 5.0 | 17.4 |

| | Average crack length (μm) | Maximum crack length (μm) | Transverse intensity (MPa) | Bulk resistance (mΩcm) | Density (g/cm$^3$) | Number of cracks |
|---|---|---|---|---|---|---|
| Comparative Example 1 | 16.2 | 50.8 | 34 | 33.5 | 6.33 | 69 |
| Example 1 | 13.2 | 41.9 | 54 | 78.2 | 6.34 | 96 |
| Comparative Example 2 | 10.6 | 31.8 | 60 | 108.3 | 6.34 | 75 |

TABLE 1-continued

| | | | | | | |
|---|---|---|---|---|---|---|
| Comparative Example 3 | 6.9 | 23.5 | 88 | 202.4 | 6.32 | 92 |
| Example 2 | 13.1 | 37.3 | 54 | 35.7 | 6.32 | 80 |
| Example 3 | 10.5 | 29.8 | 67 | 63.0 | 6.34 | 120 |
| Example 4 | 7.9 | 22.2 | 90 | 89.2 | 6.33 | 145 |
| Comparative Example 4 | 5.7 | 12.8 | 164 | 121.9 | 6.31 | 32 |
| Example 5 | 11.0 | 32.3 | 58 | 34.5 | 6.32 | 86 |
| Example 6 | 7.8 | 25.7 | 79 | 59.8 | 6.34 | 141 |
| Example 7 | 6.7 | 21.0 | 95 | 82.8 | 6.33 | 107 |
| Comparative Example 5 | 4.3 | 11.6 | 148 | 137.2 | 6.30 | 50 |
| Example 8 | 8.8 | 26.3 | 65 | 25.3 | 6.34 | 113 |
| Example 9 | 6.1 | 16.5 | 120 | 38.5 | 6.33 | 78 |
| Example 10 | 4.3 | 11.4 | 183 | 53.6 | 6.33 | 60 |
| Example 11 | 3.4 | 9.0 | 175 | 89.7 | 6.33 | 46 |
| Comparative Example 6 | 2.0 | 4.2 | 142 | 129.8 | 6.20 | 25 |
| Example 12 | 6.7 | 23.5 | 87 | 21.5 | 6.33 | 138 |
| Example 13 | 4.8 | 17.8 | 130 | 35.0 | 6.32 | 125 |
| Example 14 | 3.6 | 10.4 | 167 | 46.3 | 6.32 | 103 |
| Example 15 | 3.2 | 7.5 | 170 | 85.0 | 6.31 | 65 |
| Comparative Example 7 | 1.9 | 3.7 | 110 | 140.8 | 6.08 | 33 |
| Example 16 | 9.1 | 24.8 | 78 | 30.8 | 6.33 | 133 |
| Example 17 | 8.3 | 23.5 | 82 | 45.1 | 6.33 | 120 |
| Example 18 | 6.6 | 16.9 | 91 | 20.2 | 6.33 | 114 |
| Example 19 | 6.3 | 15.9 | 98 | 30.3 | 6.33 | 98 |
| Comparative Example 8 | 15.3 | 48.0 | 32 | 80.7 | 6.31 | 125 |
| Comparative Example 9 | 11.0 | 32.0 | 41 | 65.3 | 6.32 | 128 |

Comparative Examples 1 to 3

An $In_2O_3$ powder, a $Ga_2O_3$ powder, and a ZnO powder were weighed so that the compositional ratio of the sintered compact becomes 1.00:1.00:1.00 in terms of an atomic ratio of In, Ga and Zn, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm$^2$ to obtain a green compact. Next, the obtained green compact was subject to double vacuum packing in vinyl, and CIP at 1500 to 4000 kgf/cm$^2$, and thereafter sintered in an oxygen atmosphere at a temperature of 1430° C. (Comparative Example 1), 1300° C. (Comparative Example 2), or 1250° C. (Comparative Example 3) for 15 hours, and, after a temperature drop to 500° C. at 1.67° C./min, the obtained sintered compacts were allowed to cool in the furnace respectively.

With the IGZO sintered compact obtained under the conditions of Comparative Example 1, the average length of the cracks in the SEM image (visual field: 90 μm×120 μm) was 16.2 μm and the maximum length of cracks was 50.8 μm, which failed to satisfy the requirements of the present invention, and the transverse intensity of the sintered compact was low at 34 MPa. With the IGZO sintered compacts obtained under the conditions of Comparative Examples 2 and 3, the lengths of the cracks satisfied the requirements of the present invention, and the transverse intensity was high, but the bulk resistance exhibited a high value in excess of 100 mΩcm.

Examples 2 to 4, Comparative Example 4

An $In_2O_3$ powder, a $Ga_2O_3$ powder, and a ZnO powder were weighed so that the compositional ratio of the sintered compact becomes 1.00:1.00:1.01 in terms of an atomic ratio of In, Ga and Zn, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm$^2$ to obtain a green compact. Next, the obtained green compact was subject to double vacuum packing in vinyl, and CIP at 1500 to 4000 kgf/cm$^2$, and thereafter sintered in an oxygen atmosphere at a temperature of 1430° C. (Example 2), 1350° C. (Example 3), 1300° C. (Example 4), or 1250° C. (Comparative Example 4) for 15 hours, and, after a temperature drop to 500° C. at 1.67° C./min, the obtained sintered compacts were allowed to cool in the furnace respectively.

With the IGZO sintered compacts obtained under the conditions of Examples 2 to 4, the lengths of the cracks in the SEM image (visual field: 90 μm×120 μm) all satisfied the requirements of the present invention, and IGZO sintered compacts all having a transverse intensity of 50 MPa or more, a bulk resistance of 100 mΩcm or less, a high mechanical strength and a low resistance were obtained. Moreover, the average grain size of the sintered compact was 22 μm or less and the sintered compact density was 6.10 g/cm$^3$ or more, and high-density IGZO sintered compacts were obtained. With the IGZO sintered compact obtained under the conditions of Comparative Example 4, the lengths of the cracks satisfied the requirements of the present invention, and the transverse intensity was high, but the bulk resistance exhibited a high value in excess of 100 mΩcm.

Examples 5 to 7, Comparative Example 5

An $In_2O_3$ powder, a $Ga_2O_3$ powder, and a ZnO powder were weighed so that the compositional ratio of the sintered compact becomes 1.00:1.00:1.02 in terms of an atomic ratio of In, Ga and Zn, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm² to obtain a green compact. Next, the obtained green compact was subject to double vacuum packing in vinyl, and CIP at 1500 to 4000 kgf/cm², and thereafter sintered in an oxygen atmosphere at a temperature of 1430° C. (Example 5), 1350° C. (Example 6), 1300° C. (Example 7), or 1250° C. (Comparative Example 5) for 15 hours, and, after a temperature drop to 500° C. at 1.67° C./min, the obtained sintered compacts were allowed to cool in the furnace respectively.

With the IGZO sintered compacts obtained under the conditions of Examples 5 to 7, the lengths of the cracks in the SEM image (visual field: 90 μm×120 μm) all satisfied the requirements of the present invention, and IGZO sintered compacts all having a transverse intensity of 50 MPa or more, a bulk resistance of 100 mΩcm or less, a high mechanical strength and a low resistance were obtained. Moreover, the average grain size of the sintered compact was 22 μm or less and the sintered compact density was 6.10 g/cm³ or more, and high-density IGZO sintered compacts were obtained. With the IGZO sintered compact obtained under the conditions of Comparative Example 5, the lengths of the cracks satisfied the requirements of the present invention, and the transverse intensity was high, but the bulk resistance exhibited a high value in excess of 100 mΩcm.

Examples 8 to 11, Comparative Example 6

An In₂O₃ powder, a Ga₂O₃ powder, and a ZnO powder were weighed so that the compositional ratio of the sintered compact becomes 1.00:1.00:1.05 in terms of an atomic ratio of In, Ga and Zn, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm² to obtain a green compact. Next, the obtained green compact was subject to double vacuum packing in vinyl, and CIP at 1500 to 4000 kgf/cm², and thereafter sintered in an oxygen atmosphere at a temperature of 1430° C. (Example 8), 1350° C. (Example 9), 1300° C. (Example 10), 1275° C. (Example 11), or 1250° C. (Comparative Example 6) for 15 hours, and, after a temperature drop to 500° C. at 1.67° C./min, the obtained sintered compacts were allowed to cool in the furnace respectively.

With the IGZO sintered compacts obtained under the conditions of Examples 8 to 11, the lengths of the cracks in the SEM image (visual field: 90 μm×120 μm) all satisfied the requirements of the present invention, and IGZO sintered compacts all having a transverse intensity of 50 MPa or more, a bulk resistance of 100 mΩcm or less, a high mechanical strength and a low resistance were obtained. Moreover, the average grain size of the sintered compact was 22 μm or less and the sintered compact density was 6.10 g/cm³ or more, and high-density IGZO sintered compacts were obtained. With the IGZO sintered compact obtained under the conditions of Comparative Example 6, the lengths of the cracks satisfied the requirements of the present invention, and the transverse intensity was high, but the bulk resistance exhibited a high value in excess of 100 mΩcm.

Examples 12 to 15, Comparative Example 7

An In₂O₃ powder, a Ga₂O₃ powder, and a ZnO powder were weighed so that the compositional ratio of the sintered compact becomes 1.00:1.00:1.10 in terms of an atomic ratio of In, Ga and Zn, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm² to obtain a green compact. Next, the obtained green compact was subject to double vacuum packing in vinyl, and CIP at 1500 to 4000 kgf/cm², and thereafter sintered in an oxygen atmosphere at a temperature of 1430° C. (Example 12), 1350° C. (Example 13), 1300° C. (Example 14), 1275° C. (Example 15), or 1250° C. (Comparative Example 7) for 15 hours, and, after a temperature drop to 500° C. at 1.67° C./min, the obtained sintered compacts were allowed to cool in the furnace respectively.

With the IGZO sintered compacts obtained under the conditions of Examples 12 to 15, the lengths of the cracks in the SEM image (visual field: 90 μm×120 μm) all satisfied the requirements of the present invention, and IGZO sintered compacts all having a transverse intensity of 50 MPa or more, a bulk resistance of 100 mΩcm or less, a high mechanical strength and a low resistance were obtained. Moreover, the average grain size of the sintered compact was 22 μm or less and the sintered compact density was 6.10 g/cm³ or more, and high-density IGZO sintered compacts were obtained. With the IGZO sintered compact obtained under the conditions of Comparative Example 7, the lengths of the cracks satisfied the requirements of the present invention, and the transverse intensity was high, but the bulk resistance exhibited a high value in excess of 100 mΩcm.

Examples 16 to 19

An In₂O₃ powder, a Ga₂O₃ powder, and a ZnO powder were weighed so that the compositional ratio of the sintered compact becomes an atomic ratio of In, Ga and Zn indicated in Table 1, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm² to obtain a green compact. Next, the obtained green compact was subject to double vacuum packing in vinyl, and CIP at 1500 to 4000 kgf/cm², and thereafter sintered in an air atmosphere at a temperature of 1350° C. (Examples 16 and 18) or 1300° C. (Examples 17 and 19) for 15 hours, and, after a temperature drop to 500° C. at 1.67° C./min, the obtained sintered compacts were allowed to cool in the furnace respectively.

With the IGZO sintered compacts obtained under the conditions of Examples 16 to 18, the lengths of the cracks in the SEM image (visual field: 90 μm×120 μm) all satisfied the requirements of the present invention, and IGZO sintered compacts all having a transverse intensity of 50 MPa or more, a bulk resistance of 100 mΩcm or less, a high mechanical strength and a low resistance were obtained. Moreover, the average grain size of the sintered compact was 22 μm or less and the sintered compact density was 6.10 g/cm³ or more, and high-density IGZO sintered compacts were obtained.

Comparative Examples 8 and 9

An In₂O₃ powder, a Ga₂O₃ powder, and a ZnO powder were weighed so that the compositional ratio of the sintered compact becomes an atomic ratio of In, Ga and Zn indicated in Table 1, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm² to obtain a green compact.

Next, the obtained green compact was subject to double vacuum packing in vinyl, and CIP at 1500 to 4000 kgf/cm², and thereafter sintered in an air atmosphere at a temperature of 1350° C. for 15 hours, and, in Comparative Example 8, after a temperature drop to 500° C. at 0.5° C./min, the obtained sintered compact was allowed to cool in the furnace. Meanwhile, in Comparative Example 9, after a temperature drop to 500° C. at 5° C./min, the obtained sintered compact was allowed to cool in the furnace.

With the IGZO sintered compact obtained under the conditions of Comparative Example 8, the lengths of the cracks failed to satisfy the requirements of the present invention. As described above, this is considered to be a result of the crystal grain growth being promoted even during the temperature-drop process. Meanwhile, with the IGZO sintered compact obtained under the conditions of Comparative Example 9, the length of cracks satisfied the requirements of the present invention, but the transverse intensity exhibited a low value at 41 MPa. As described above, this is considered to be because the residual stress inside the sintered compact is great, and therefore the strength has deteriorated.

Figure 2:
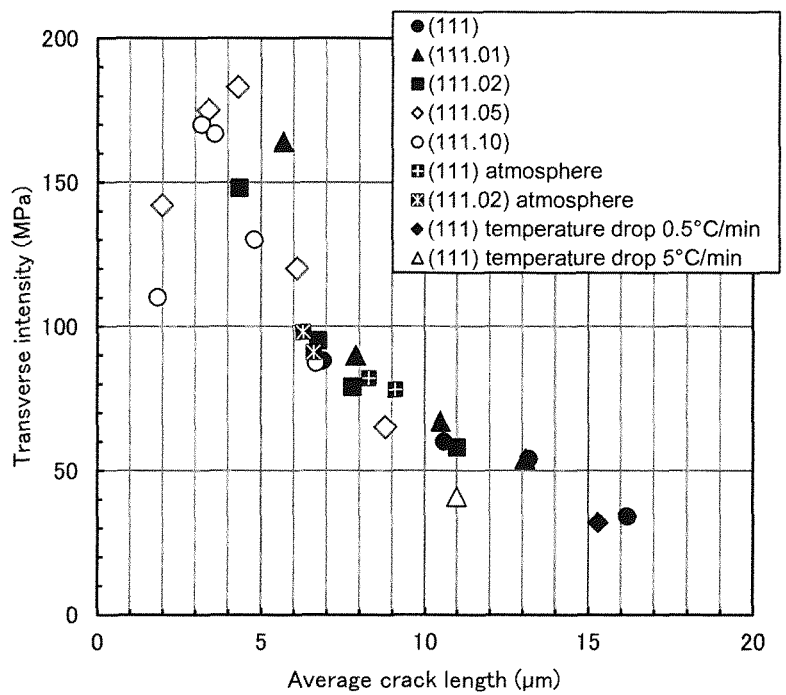
FIG. 2 This is a diagram showing the relation of the average crack length and the transverse intensity.
Figure 3:
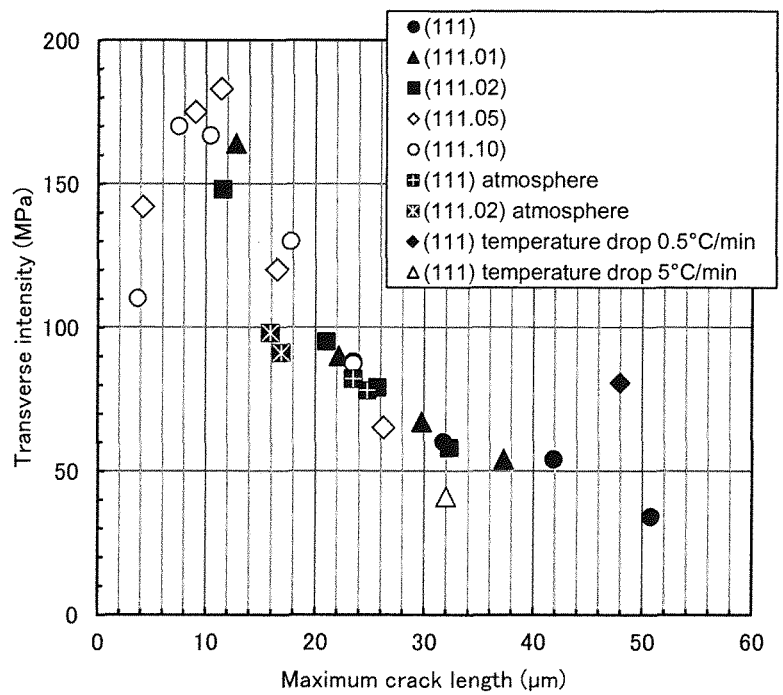
FIG. 3 This is a diagram showing the relation of the maximum crack length and the transverse intensity.
Figure 4:
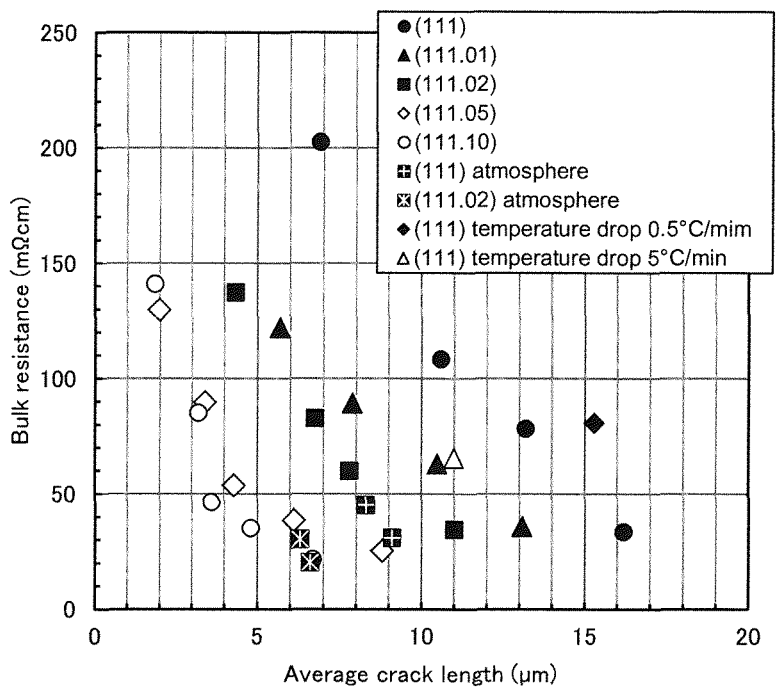
FIG. 4 This is a diagram showing the relation of the average crack length and the bulk resistance.
Figure 5:
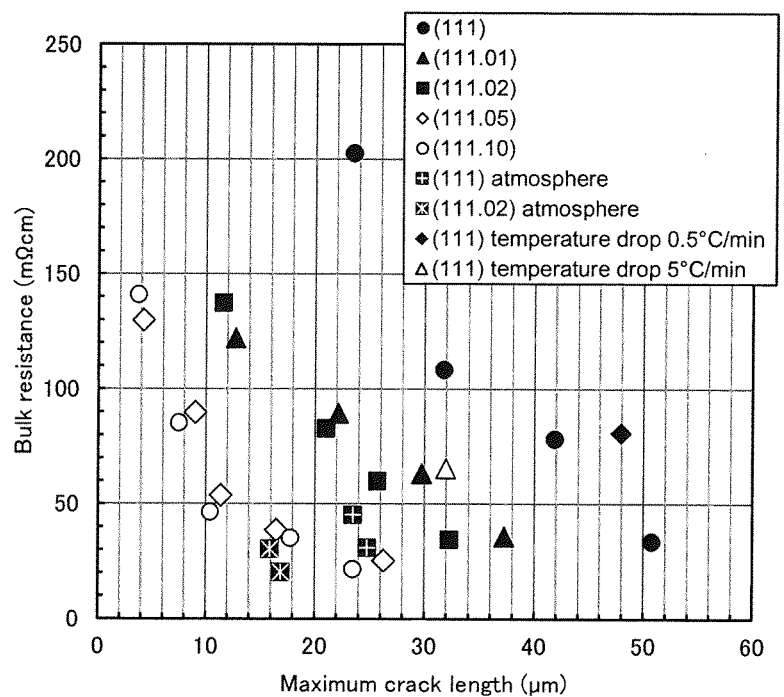
FIG. 5 This is a diagram showing the relation of the maximum crack length and the bulk resistance.

The relation of the crack length and the transverse intensity regarding the IGZO sintered compacts in the foregoing Examples and Comparative Examples. is shown in FIG. 2 and FIG. 3. Moreover, the relation of the crack length and the bulk resistance is shown in FIG. 4 and FIG. 5. As shown in FIG. 2 to FIG. 5, by appropriately controlling the length of cracks, it was possible to prepare sintered compacts having a transverse intensity of 50 MPa or more and a bulk resistance of 100 mΩcm or less.

Note that the number of cracks in each of the IGZO sintered compacts in the foregoing Examples and Comparative Examples is shown in Table 1. As shown in Table 1, even if the number of cracks is numerous, it is possible to obtain a sintered compact having a high mechanical strength, as long as the crack length is controlled.

INDUSTRIAL APPLICABILITY

The oxide sintered compact of the present invention can be used to form a sputtering target capable of achieving a high transverse intensity and a low bulk resistance. This target is free from cracks and has limited generation of particles when being subject to DC sputtering, and thus it is possible to form high quality thin films. By using this kind of sputtering target, it is possible to yield a superior effect of being able to stably mass-produce oxide semiconductor films and the like. The oxide semiconductor film of the present invention is particularly useful as an active layer of TFT in a backplane of a flat panel display or a flexible panel display.

The invention claimed is:

1. An IGZO sintered compact composed of indium (In), gallium (Ga), zinc (Zn), oxygen (O) and unavoidable impurities, wherein:
    an average length of cracks existing in the IGZO sintered compact is 3 µm or more and 15 µm or less;
    the IGZO sintered compact has a transverse intensity of 50 MPa or more, a bulk resistance of 20.2 mΩcm or more and 100 mΩcm or less, and a density of 6.31 g/cm³ or more; and
    an atomic ratio of In, Ga, and Zn satisfies the following formulae:

$$0.314 \leq In/(In+Ga+Zn) \leq 0.342;$$

$$0.314 \leq Ga/(In+Ga+Zn) \leq 0.342; \text{ and}$$

$$0.325 \leq Zn/(In+Ga+Zn) \leq 0.364.$$

2. The IGZO sintered compact according to claim 1, wherein a maximum length of cracks existing in the IGZO sintered compact is 6 µm or more and 45 µm or less.

3. The IGZO sintered compact according to claim 2, wherein the IGZO sintered compact has an average crystal grain size of 22 µm or less.

4. A plate-shaped or cylindrical sputtering target formed from the IGZO sintered compact according to claim 1.

5. The IGZO sintered compact according to claim 1, wherein the IGZO sintered compact has an average crystal grain size of 22 µm or less.

* * * * *